(12) United States Patent
Lai

(10) Patent No.: US 8,253,148 B2
(45) Date of Patent: Aug. 28, 2012

(54) LIGHT EMITTING DIODE AND METHOD FOR MANUFACTURING THE SAME

(75) Inventor: Chih-Chen Lai, Taipei Hsien (TW)

(73) Assignee: Hon Hai Precision Industry Co., Ltd., Tu-Cheng, New Taipei (TW)

( * ) Notice: Subject to any disclaimer, the term of this patent is extended or adjusted under 35 U.S.C. 154(b) by 164 days.

(21) Appl. No.: 12/824,481

(22) Filed: Jun. 28, 2010

(65) Prior Publication Data

US 2011/0297953 A1    Dec. 8, 2011

(30) Foreign Application Priority Data

Jun. 7, 2010   (TW) .............................. 99118289 A

(51) Int. Cl.
H01L 27/15 (2006.01)
H01L 29/267 (2006.01)
H01L 31/12 (2006.01)
H01L 33/00 (2010.01)

(52) U.S. Cl. .............. 257/81; 257/54; 257/79; 257/461; 257/E21.012

(58) Field of Classification Search .................... 257/53, 257/54, 461, E31.012, 79, 81
See application file for complete search history.

(56) References Cited

U.S. PATENT DOCUMENTS

| 2002/0002992 | A1* | 1/2002 | Kariya et al. | 136/255 |
| 2003/0227017 | A1* | 12/2003 | Yasuno | 257/53 |
| 2009/0090922 | A1* | 4/2009 | Fukunaga et al. | 257/94 |

* cited by examiner

*Primary Examiner* — Jarrett Stark
*Assistant Examiner* — John M Parker
(74) *Attorney, Agent, or Firm* — Altis Law Group, Inc.

(57) ABSTRACT

An exemplary light emitting diode includes a conductive base, an LED die, a transparent conductive layer and at least one pad. The LED die includes a p-type GaN layer connected to the base, an active layer on the p-type GaN layer, and an n-type GaN layer on the active layer. The transparent conductive layer is coated on an exposed side of the n-type GaN layer. The exposed side has an arched central portion, which in one embodiment is concave and in another embodiment is convex. The at least one n-side pad is mounted on the transparent conductive layer. The at least one n-side pad and the conductive base are for connecting with a power source.

19 Claims, 9 Drawing Sheets

LIGHT EMITTING DIODE AND METHOD FOR MANUFACTURING THE SAME

BACKGROUND

1. Technical Field

The present disclosure relates to semiconductor devices, and more particularly to a light emitting diode. The present disclosure also relates to a method for manufacturing the light emitting diode.

2. Description of Related Art

Conventionally, a light emitting diode includes an active layer, an n-type GaN layer, and a p-type GaN layer at opposite sides of the active layer. A p-side pad and an n-side pad are mounted on and ohmic contact outer surfaces of the p-type GaN layer and the n-type GaN layer, respectively. Electron moves from the n-type GaN to the p-type GaN to supply a current injected into the active layer when the pads of the light emitting diode are electrically connected to a power source. In such a light emitting diode, current crowding typically occurs between the active layer and the p-side pad because the electrons are accumulated on the shortest passage between the p-side pad and the n-side pad. The current crowding will prevent uniform light generation and make the light emitting diode overheat.

It is thus desirable to provide a light emitting diode and a method for manufacturing the light emitting diode which can overcome the described limitations.

DETAILED DESCRIPTION

Figure 1:
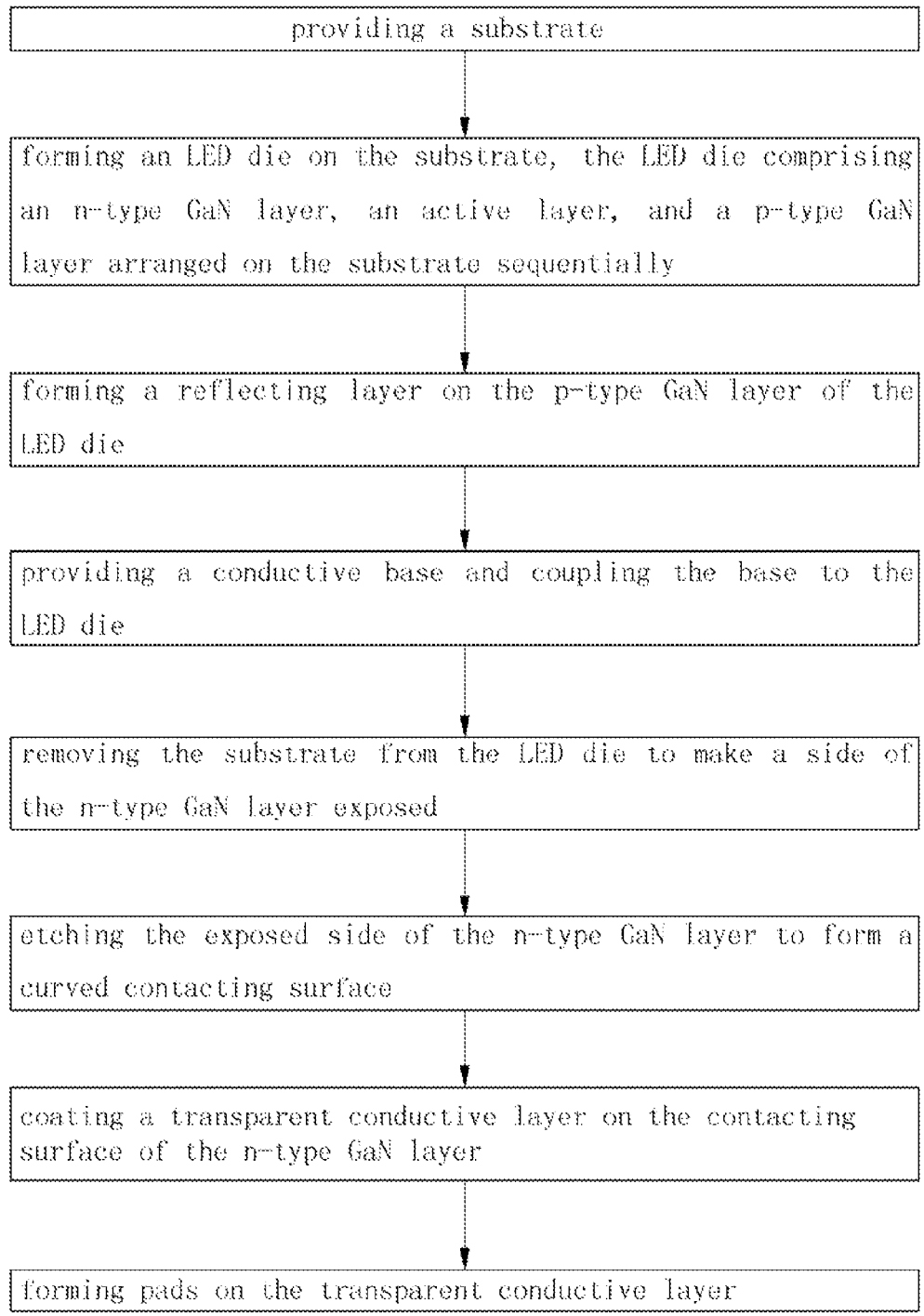
FIG. 1 is a flow chart of a method for manufacturing a light emitting diode according to an exemplary embodiment.

Referring to FIG. 1, a method for manufacturing a light emitting diode (LED) according to one embodiment is shown. The method mainly includes steps of: providing a substrate; forming an LED die on the substrate, the LED die comprising an n-type GaN layer, an active layer, and a p-type GaN layer arranged on the substrate sequentially; forming a reflecting layer on the p-type GaN layer of the LED die; providing a conductive base and coupling the base to the LED die; removing the substrate from the LED die to make a side of the n-type GaN layer exposed; etching the exposed n-type GaN layer to form a curved contacting surface; coating a transparent conductive layer on the contacting surface of the n-type GaN layer; and forming pads on the transparent conductive layer. Exemplary details of the method are given below.

Figure 2:
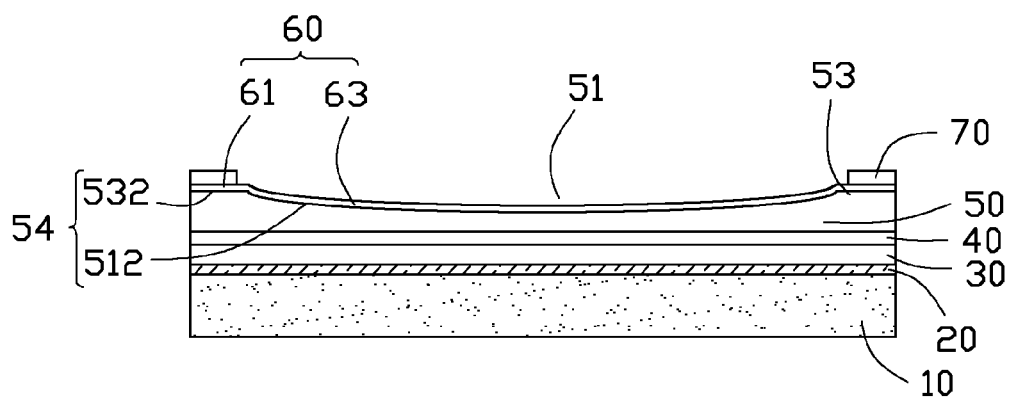
FIG. 2 is a schematic view of a light emitting diode in accordance with a first embodiment of the present disclosure.

Referring to FIG. 2, an exemplary LED made according to the method is shown. The LED includes a base 10, a reflecting layer 20, an LED die, and a transparent conductive layer 60. The base 10 is conductive. The LED die includes a p-type GaN layer 30, an active layer 40, and an n-type GaN layer 50. The reflecting layer 20, p-type GaN layer 30, active layer 40, n-type GaN layer 50 and transparent conductive layer 60 are arranged on a top surface of the base 10 sequentially along a direction away from the conductive substrate 10. Two n-side pads 70 are secured on opposite lateral portions of the transparent conductive layer 60. The transparent conductive layer 60 is a negative pole and the base 10 is a positive pole of the LED of the present disclosure. The n-side pads 70 and the base 10 electrically connect a positive pole and a negative pole of a power source to make electrons move from the transparent conductive layer 60 to the base 10 to supply a current injected into the active layer 40.

Figure 3:
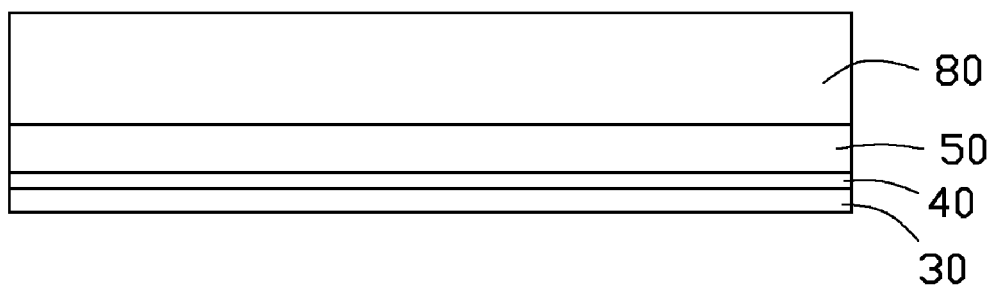
FIG. 3 is a schematic view showing an LED die formed at a bottom of a substrate, according to a second step of the method of FIG. 1.

Referring also to FIG. 3, for manufacturing the LED, firstly, a substrate 80 is provided. Preferably, the substrate 80 is a sapphire substrate. Then the n-type GaN layer 50, the active layer 40, and the p-type GaN layer 30 of the LED die are in turn formed on a bottom surface of the substrate 80 by a metal-organic chemical vapor deposition (MOCVD) method.

Figure 4:
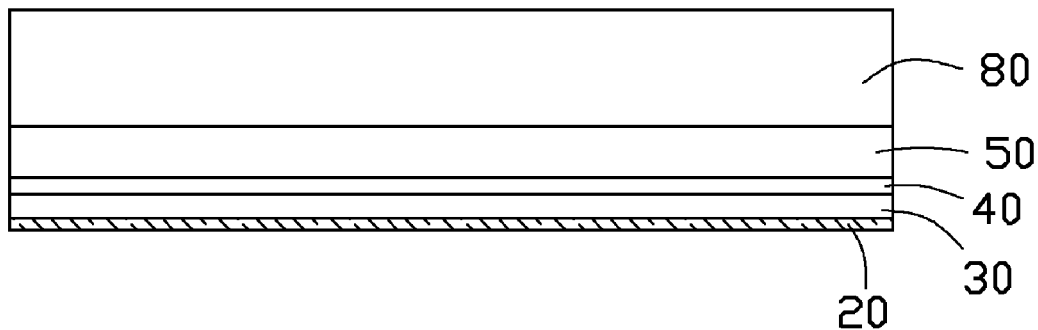
FIG. 4 is a schematic view showing a reflecting layer formed on a p-type layer of the LED die of FIG. 2, according to a third step of the method.

Referring to FIG. 4, the reflecting layer 20 is then formed on a bottom surface of the p-type GaN layer 30 by a plasma enhancement chemical vapor deposition (PECVD) method. The reflecting layer 20 is made of titanium, aluminum, or alloy thereof. The reflecting layer 20 reflects light emitting from the active layer 30 to improve light extraction efficiency of the light emitting diode.

Figure 5:
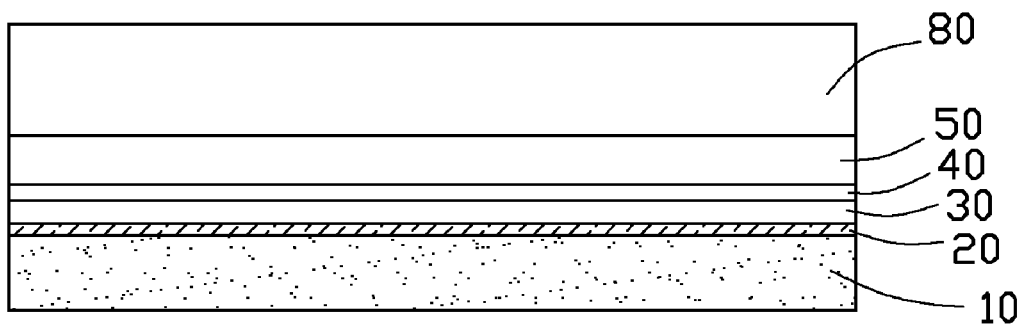
FIG. 5 shows a base being coupled to the reflecting layer of FIG. 3, according to a fourth step of the method.

Referring to FIG. 5, the base 10 is then provided and attached to a bottom surface of the reflecting layer 20 by plating. The base 10 is made of copper.

Figure 6:
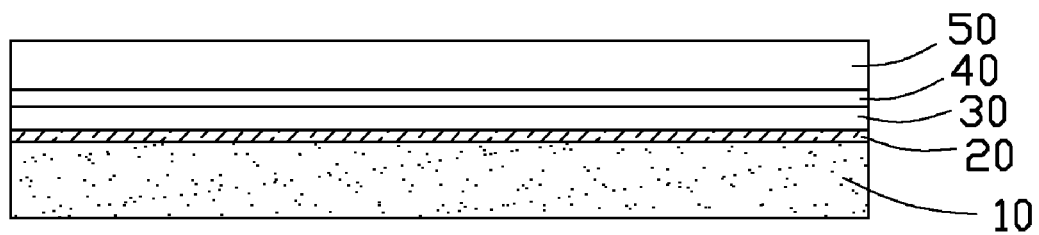
FIG. 6 is similar to FIG. 4, but shows the substrate being removed to expose an n-type layer of the LED die, according to a fifth step of the method.
Figure 7:
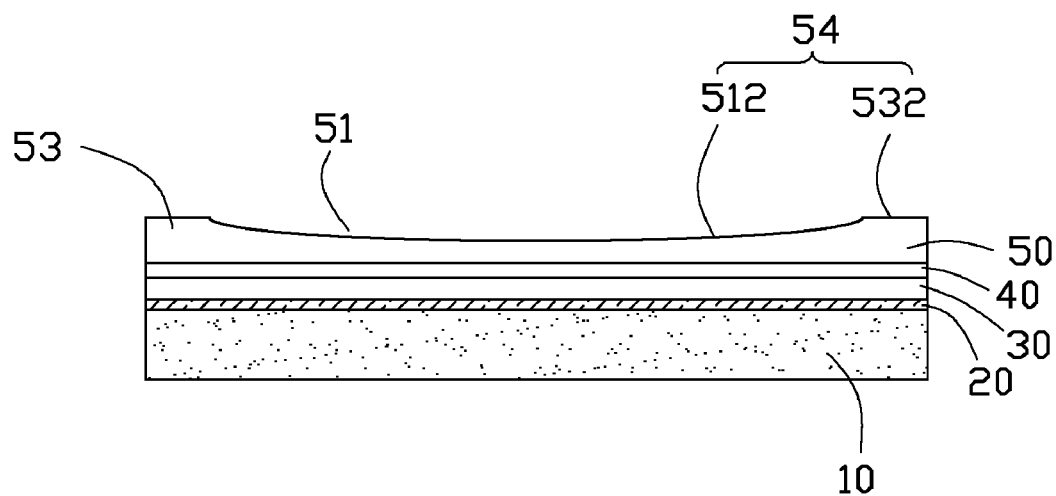
FIG. 7 shows a contacting surface formed on at a central portion of the n-type layer of the LED die of FIG. 6, according to a sixth step of the method.

After above steps, the substrate 80 is peeled from the n-type GaN layer 50 to make a top side of the n-type GaN layer 50 exposed, as shown in FIG. 6. Then, as shown in FIG. 7, a central portion of the top side of the n-type GaN layer 50 is etched by excimer laser to define a recess 51 therein. A depth of the recess 51 generally decreases from a middle portion to opposite lateral sides. The recess 51 has a concave, arc-shaped contacting surface 512 to increase an area of a top side of the n-type GaN layer 50. Two shoulders 53 are formed on opposite ends of the n-type GaN layer 50, sandwiching the contacting surface 512 therebetween. A top of each shoulder 53 is a supporting surface 532 to support a corresponding n-side pad 70 thereon. The supporting surfaces 532 are higher than and surround the contacting surface 512. The supporting surfaces 532 and the contacting surface 512 cooperatively form a touching surface 54. A ratio of the maximal depth of the recess 51 to a thickness of the n-type GaN layer 50 is about 25~50%. A ratio of a length of the supporting surface 532 along a longitudinal direction of the touching surface 54 to that of the contacting surface 512 is about 4~25%. Preferably, the thickness of the n-type GaN layer 50 is 3 μm, the maximal depth of the recess 51 is 1.5 μm, the length of the supporting surface 532 is varied between 160~200 μm, and the length of the contacting surface 532 is varied between 800~2000 μm.

Figure 8:
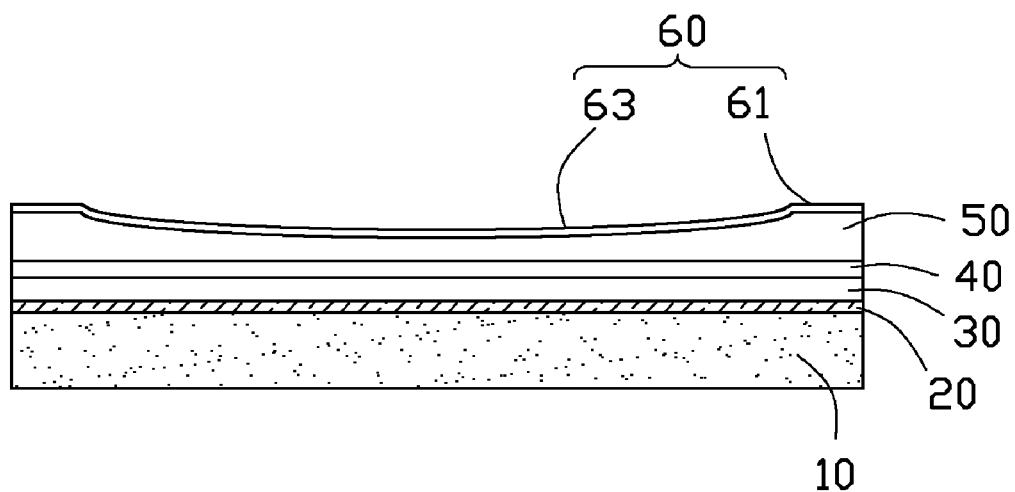
FIG. 8 illustrates a transparent conductive layer formed on the contacting surface of FIG. 6, according to a seventh step of the method.

Referring to FIG. 8, the transparent conductive layer 60 is secured on the touching surface 54 of the n-type GaN layer 50 and covers an entirety of the touching surface 54. The transparent conductive layer 60 ohmic contacts the touching surface 54.

The transparent conductive layer 60 is a very thin film with a thickness between 0.01-0.2 μm. The transparent conductive layer 60 is made of ITO, IZO, NiO, $In_2O_3$, ZnO, CdO, $TiO_2$, $CdIn_2O_4$, $Zn_2SnO_4$, $CaGaO_4$, etc. A resistance of the transparent conductive layer 60 is much lower than that of the n-type GaN layer 50. The transparent conductive layer 60 includes two planar covering portions 61 and a concaved covering portion 63 between the planar covering portions 61. The planar covering portions 61 cover the supporting surfaces 532 of the shoulders 53 of the n-type GaN layer 50. The concaved covering portion 63 covers the contacting surface 512 of the n-type GaN layer 50.

Referring to FIG. 2 again, finally, the two n-side pads 70 are respectively secured on the first covering portions 61 of the conductive layer 60 to form the LED.

In this embodiment, the transparent conductive layer 60 and the base 10 are located at opposite sides of the active layer 40. The transparent conductive layer 60 covers the entire n-type GaN layer 50, and the conductive base 10 covers the bottom surface of the reflecting layer 20. When the light emitting diode in use, the n-side pads 70 are connected to the positive pole and the base 10 are connected to the negative pole of the power source. Here the base 10 function as the p-side pad of the light emitting diode of the disclosure. Electrons move from the n-side pads 70 towards the base 10. Part of the electrons moves vertically through the first covering portions 61 and then the shoulders 53 of the n-type GaN layer 50 towards lateral portions of the conductive base 10 to obtain the shortest route. Other part of the electrons moves to and evenly distributed on the second covering portion 63 since the transparent conductive layer 60 has a low resistance. Then the electrons on the transparent conductive layer 60 move vertically through the contacting surface 512 of the n-type GaN layer 50 towards a central portion of the conductive base 10. Therefore, the electrons rum from the whole of the transparent conductive layer 60 to the conductive base 10. Thus, current crowding is avoided and the light emitting diode has good and reliable performance relative to the conventional light emitting diode.

Figure 9:
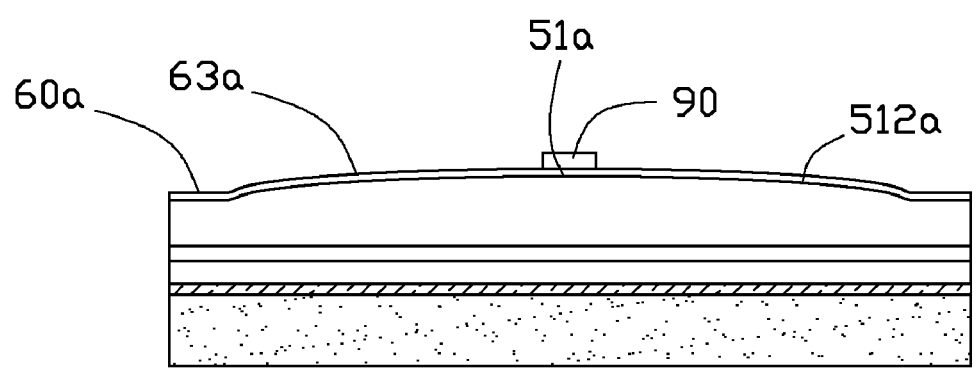
FIG. 9 is a schematic view of a light emitting diode in accordance with a second embodiment of the present disclosure.

Referring also to FIG. 9, an alternative light emitting diode formed according to the method is shown. In this embodiment, a top face of opposite lateral portions of the n-type GaN layer 50 are etched; thus, the n-type GaN layer 50 forms a convex, arc-shaped protruding portion 51a at a central portion thereof. A thickness of the protruding portion 51a decreases from a middle portion to the opposite lateral portions. A ratio of a maximal thickness of the protruding portion 51a to a thickness of the n-type GaN layer 50 is about to 25~50%. Preferably, the maximal thickness of the protruding portion 51a is 1.5 μm. A top surface 512a of the protruding portion 51a is convex. A transparent conductive layer 60a coated on the n-type GaN layer 50 has a shape matching the n-type GaN layer 50. The transparent conductive layer 60a has a convex covering portion 63a covering the protruding portion 51a for increasing an area of the transparent conductive layer 60a and a planar portion around the convex covering portion 63a. An n-type electrical pad 90 is secured on a peak of the transparent conductive layer 60a. The n-side pad 90 and the base 10 electrically connect the power source.

It is to be understood, however, that even though numerous characteristics and advantages of the disclosure have been set forth in the foregoing description, together with details of the structure and function of the embodiments, the disclosure is illustrative only, and changes may be made in detail, especially in matters of shape, size, and arrangement of parts within the principles of the disclosure to the full extent indicated by the broad general meaning of the terms in which the appended claims are expressed.

What is claimed is:

1. A light emitting diode comprising:
    a conductive base;
    an LED die formed on the base, the LED die comprising a p-type GaN layer connected to the base, an active layer on the p-type GaN layer, an n-type GaN layer on the active layer;
    a transparent conductive layer coated on the n-type GaN layer; and
    at least one n-side pad mounted on the transparent conductive layer, in which the at least one n-side pad and the conductive base are configured for electrically connecting with a power source;
    wherein an outer surface of the transparent conductive layer comprises a curved portion and a planar portion around the curved portion.

2. The light emitting diode of claim 1, wherein the curved portion of the outer surface of the transparent conductive layer is convex, and the at least one n-side pad is mounted on a peak of the curved portion.

3. The light emitting diode of claim 1, wherein the curved portion is concave, and the at least one n-side pad is mounted on the planar portion of the outer surface of the transparent conductive layer.

4. The light emitting diode of claim 3, wherein the n-type GaN layer defines a recess at a central portion matching with the curved portion of the transparent conductive layer.

5. The light emitting diode of claim 4, wherein a ratio of the maximal depth of the recess to a thickness of the n-type GaN layer is about to 25~50%.

6. The light emitting diode of claim 5, wherein a thickness of the n-type GaN layer is 3 μm, and the maximal depth of the recess is 1.5 μm.

7. The light emitting diode of claim 4, wherein the n-type GaN layer comprises two shoulders at opposite sides of the recess, each shoulder comprises a planar supporting surface matching the planar potion of the transparent conductive layer.

8. The light emitting diode of claim 7, wherein a ratio of a length of the supporting surface to a length of the recess is about 4~25%.

9. The light emitting diode of claim 8, wherein a length of the supporting surface is varied between 160~200 μm, and a length of the recess is varied between 800~2000 μm.

10. The light emitting diode of claim 1, wherein the transparent conductive layer is a film with a thickness between 0.01~0.2 μm.

11. The light emitting diode of claim 1, wherein a resistance of the transparent conductive layer is lower than that of the n-type GaN layer.

12. The light emitting diode of claim 1, further comprising a reflecting layer sandwiched between the p-type GaN layer and the conductive base.

13. A method for manufacturing a light emitting diode comprising:
    providing a substrate with an LED die formed thereon, the LED die comprising an n-type GaN layer, an active layer, and a p-type GaN layer arranged on the substrate sequentially along a direction away from the substrate;
    providing a conductive base and securing the conductive base to the p-type GaN layer;
    removing the substrate from the n-type GaN layer to expose the n-type GaN layer;

processing an outer surface of the n-type GaN layer to have a curved portion and a planar portion around the curved portion;

coating a transparent conductive layer on the n-type GaN layer, wherein an outer surface of the transparent conductive layer comprises a curved portion and a planar portion around the curved portion of the transparent conductive layer; and forming at least one n-side pad on the transparent conductive layer, in which the at least one n-side pad and conductive base are configured for electrically connecting a power source.

14. The method of claim 13, wherein the processing of the outer surface of the n-type GaN layer comprises etching a central portion of the n-type GaN layer before coating the transparent conductive layer to form a concaved surface at the central portion of the n-type GaN layer.

15. The method of claim 14, wherein a central portion of the transparent conductive layer is concave.

16. The method of claim 13, wherein the processing of the outer surface of the n-type GaN layer comprises etching a periphery of the n-type GaN layer before coating the transparent conductive layer to form a convex surface at a central portion of the n-type GaN layer.

17. The method of claim 16, wherein a central portion of the transparent conductive layer is convex.

18. The method of claim 13, wherein the LED die is formed on the substrate by metal-organic chemical vapor deposition.

19. The method of claim 18, further comprising coating a reflecting layer on the p-type GaN layer by plasma enhancement chemical vapor deposition before securing the conductive base to the p-type GaN layer.

* * * * *